US010468295B2

(12) United States Patent
Libbert et al.

(10) Patent No.: US 10,468,295 B2
(45) Date of Patent: Nov. 5, 2019

(54) HIGH RESISTIVITY SILICON-ON-INSULATOR STRUCTURE AND METHOD OF MANUFACTURE THEREOF

(71) Applicant: SunEdison Semiconductor Limited (UEN201334164H), Singapore (SG)

(72) Inventors: Jeffery L. Libbert, O'Fallon, MO (US); Qingmin Liu, Glen Carbon, IL (US); Gang Wang, Grover, MO (US); Andrew M. Jones, Wildwood, MO (US)

(73) Assignee: GLOBALWAFERS CO. LTD. (TW)

( * ) Notice: Subject to any disclaimer, the term of this patent is extended or adjusted under 35 U.S.C. 154(b) by 0 days.

(21) Appl. No.: 15/828,534

(22) Filed: Dec. 1, 2017

(65) Prior Publication Data
US 2018/0158721 A1 Jun. 7, 2018

Related U.S. Application Data

(60) Provisional application No. 62/429,922, filed on Dec. 5, 2016.

(51) Int. Cl.
*H01L 23/00* (2006.01)
*H01L 21/762* (2006.01)
(Continued)

(52) U.S. Cl.
CPC .... *H01L 21/76256* (2013.01); *H01L 21/0214* (2013.01); *H01L 21/0217* (2013.01); *H01L 21/0234* (2013.01); *H01L 21/0262* (2013.01); *H01L 21/02164* (2013.01); *H01L 21/02211* (2013.01); *H01L 21/02236* (2013.01); *H01L 21/02255* (2013.01); *H01L 21/02274* (2013.01); *H01L 21/02529* (2013.01); *H01L 21/02595* (2013.01); *H01L 21/3211* (2013.01); *H01L 21/76254* (2013.01); *H01L 23/18* (2013.01);
(Continued)

(58) Field of Classification Search
CPC .. H01L 23/18; H01L 29/518; H01L 29/66833
See application file for complete search history.

(56) References Cited

U.S. PATENT DOCUMENTS 4,501,060 A 2/1985 Frye et al.
4,755,865 A 7/1988 Wilson
(Continued)

FOREIGN PATENT DOCUMENTS

EP 0939430 A2 1/1999
EP 2426701 A1 7/2012
(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.
(Continued)

*Primary Examiner* — Mounir S Amer
*Assistant Examiner* — Alexander Belousov
(74) *Attorney, Agent, or Firm* — Armstrong Teasdale LLP

(57) ABSTRACT

A multilayer structure is provided, the multilayer structure comprising a semiconductor on insulator structure comprises an insulating layer that enhances the stability of the underlying charge trapping layer.

16 Claims, 6 Drawing Sheets

(51) Int. Cl.
  *H01L 21/02* (2006.01)
  *H01L 23/18* (2006.01)
  *H01L 29/51* (2006.01)
  *H01L 29/66* (2006.01)
  *H01L 21/321* (2006.01)

(52) U.S. Cl.
  CPC ...... *H01L 29/518* (2013.01); *H01L 29/66833* (2013.01)

(56) References Cited

U.S. PATENT DOCUMENTS

| | | |
|---|---|---|
| 4,968,384 A | 11/1990 | Asano |
| 5,189,500 A | 2/1993 | Kusunoki |
| 6,043,138 A | 3/2000 | Ibok |
| 6,346,459 B1 | 2/2002 | Usenko et al. |
| 6,373,113 B1 | 4/2002 | Gardner et al. |
| 6,562,127 B1 | 5/2003 | Kud et al. |
| 6,624,047 B1 | 9/2003 | Sakaguchi et al. |
| 7,868,419 B1 | 1/2011 | Kerr et al. |
| 7,879,699 B2 | 2/2011 | Schulze et al. |
| 7,915,706 B1 | 3/2011 | Kerr et al. |
| 8,058,137 B1 | 11/2011 | Or-Bach et al. |
| 8,076,750 B1 | 12/2011 | Kerr et al. |
| 8,466,036 B2 | 6/2013 | Brindle et al. |
| 8,481,405 B2 | 7/2013 | Arriagada et al. |
| 8,796,116 B2 | 8/2014 | Grabbe et al. |
| 8,846,493 B2 | 9/2014 | Libbert et al. |
| 8,859,393 B2 | 10/2014 | Ries et al. |
| 9,202,711 B2 | 12/2015 | Liu et al. |
| 2002/0090758 A1 | 7/2002 | Henley et al. |
| 2004/0005740 A1 | 1/2004 | Lochtefeld et al. |
| 2004/0031979 A1 | 2/2004 | Lochtefeld et al. |
| 2004/0108537 A1 | 6/2004 | Tiwari |
| 2005/0153524 A1 | 7/2005 | Maa et al. |
| 2006/0030124 A1 | 2/2006 | Maa et al. |
| 2006/0033110 A1 | 2/2006 | Alam et al. |
| 2006/0226482 A1 | 10/2006 | Suvorov |
| 2007/0032040 A1 | 2/2007 | Lederer |
| 2007/0054466 A1 | 3/2007 | Hebras |
| 2009/0004833 A1 | 1/2009 | Suzuki et al. |
| 2009/0014828 A1 | 1/2009 | Mizushima et al. |
| 2009/0087631 A1 | 4/2009 | Schulze et al. |
| 2009/0092810 A1 | 4/2009 | Lee et al. |
| 2009/0321829 A1 | 12/2009 | Nguyen et al. |
| 2011/0174362 A1 | 7/2011 | Tanner et al. |
| 2011/0298083 A1 | 12/2011 | Yoneda |
| 2012/0016310 A1 | 1/2012 | Holliday |
| 2012/0091587 A1 | 4/2012 | Or-Bach et al. |
| 2012/0238070 A1 | 9/2012 | Libbert |
| 2012/0267681 A1 | 10/2012 | Nemoto et al. |
| 2013/0120951 A1 | 5/2013 | Zuo et al. |
| 2013/0122672 A1 | 5/2013 | Or-Bach et al. |
| 2013/0168835 A1 | 7/2013 | Botula et al. |
| 2013/0193445 A1 | 8/2013 | Dennard et al. |
| 2013/0294038 A1 | 11/2013 | Landru et al. |
| 2013/0344680 A1 | 12/2013 | Arriagada et al. |
| 2014/0042598 A1 | 2/2014 | Kitada et al. |
| 2014/0070215 A1* | 3/2014 | Bedell ............... H01L 29/7847 257/52 |
| 2014/0084290 A1 | 3/2014 | Allibert et al. |
| 2014/0120654 A1 | 5/2014 | Fujii et al. |
| 2014/0124902 A1 | 5/2014 | Botula et al. |
| 2014/0273405 A1 | 9/2014 | Liu et al. |
| 2015/0004778 A1 | 1/2015 | Botula et al. |
| 2015/0115480 A1 | 4/2015 | Peidous et al. |

FOREIGN PATENT DOCUMENTS

| | | |
|---|---|---|
| JP | 2012253364 A | 12/2012 |
| WO | 2009120407 A2 | 10/2009 |
| WO | 2012127006 A1 | 9/2012 |

OTHER PUBLICATIONS

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546vol. 72, No. 20.

Tong, Q. Y. et al., "Semiconductor wafer bonding: recent developments", Invited Review, Materials Chemistry and Physics, Mar. 1, 1994, pp. 101-127, vol. 37, No. 2.

International Search Report and Written Opinion of the International Searching Authority regarding PCT/US2017/064248 dated Mar. 27, 2018; pp. 1-15.

* cited by examiner

HIGH RESISTIVITY SILICON-ON-INSULATOR STRUCTURE AND METHOD OF MANUFACTURE THEREOF

CROSS REFERENCE TO RELATED APPLICATION(S)

This application claims priority to U.S. provisional application Ser. No. 62/429,922, which was filed Dec. 5, 2016, the disclosure of which is hereby incorporated by reference as if set forth in its entirety.

FIELD OF THE INVENTION

The present invention generally relates to the field of semiconductor wafer manufacture. More specifically, the present invention relates to a method of preparing a handle substrate for use in the manufacture of a semiconductor-on-insulator (e.g., silicon-on-insulator) structure, and more particularly to a method for producing a charge trapping layer in the handle wafer of the semiconductor-on-insulator structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. With reference now to FIG. 1, a silicon on insulator structure 2 comprising a very high resistivity silicon wafer 4, a buried oxide (BOX) layer 6, and a silicon device layer 10. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, with reference now to FIG. 2, one method of creating a semiconductor-on-insulator structure 20 (e.g., a silicon-on-insulator, or SOI) with a CTL for RF device applications is based on depositing an undoped polycrystalline silicon film 28 on a silicon substrate having high resistivity 22 and then forming a stack of oxide 24 and top silicon layer 26 on it. A polycrystalline silicon layer 28 acts as a high defectivity layer between the silicon substrate 22 and the buried oxide layer 24. See FIG. 2, which depicts a polycrystalline silicon film for use as a charge trapping layer 28 between a high resistivity substrate 22 and the buried oxide layer 24 in a silicon-on-insulator structure 20. An alternative method is the implantation of heavy ions to create a near surface damage layer. Devices, such as radiofrequency devices, are built in the top silicon layer 26.

It has been shown in academic studies that the polycrystalline silicon layer in between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf.*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghaëand J.-P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

SUMMARY OF THE INVENTION

The present invention is directed to a multilayer structure comprising: a single crystal semiconductor handle substrate comprising two major, generally parallel surfaces, one of which is a front surface of the single crystal semiconductor handle substrate and the other of which is a back surface of the single crystal semiconductor handle substrate, an imaginary central plane between the front surface and the back surface, a circumferential edge joining the front and back surfaces of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm; a charge trapping layer comprising a polycrystalline silicon layer, the charge trapping layer being in interfacial contact with the front surface of the single crystal semiconductor handle substrate, wherein the charge trapping layer has a minimum resistivity of at least about 1000 ohm-cm; an insulating layer comprising silicon nitride or silicon oxynitride in interfacial contact with the polycrystalline silicon layer; and a single crystal silicon device layer.

The present invention is still further directed to a method of preparing a multilayer structure, the method comprising: depositing a charge trapping layer on a front surface of a single crystal semiconductor handle substrate, wherein the single crystal semiconductor handle substrate comprises two major, generally parallel surfaces, one of which is the front surface of the single crystal semiconductor handle substrate and the other of which is a back surface of the single crystal semiconductor handle substrate, an imaginary central plane between the front surface and the back surface, a circumferential edge joining the front and back surfaces of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm and further wherein the charge trapping layer comprises polycrystalline silicon and has a minimum resistivity of at least about 1000 ohm-cm; depositing an insulating layer comprising silicon nitride or silicon oxynitride on the polycrystalline silicon layer; and bonding a dielectric layer on a front surface of a single crystal semiconductor donor substrate to the insulating layer to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, a central plane between the front and back surfaces of the semiconductor donor substrate, and a bulk region between the front and back surfaces of the semiconductor donor substrate, and further wherein the single crystal semiconductor donor substrate comprises a cleave plane.

Other objects and features will be in part apparent and in part pointed out hereinafter.

DETAILED DESCRIPTION OF THE EMBODIMENT(S) OF THE INVENTION

According to the present invention, a method is provided for preparing a semiconductor-on-insulator composite structure (SOI, e.g., a silicon-on-insulator composite structure) comprising a charge trapping layer (CTL). The present invention is further directed to a semiconductor-on-insulator composite structure (e.g., a silicon-on-insulator composite structure comprising a charge trapping layer (CTL). This disclosure provides a method of engineering the single crystal semiconductor handle substrate to enhance electrical performance of SOI structure used in radiofrequency devices.

In some embodiments, the present invention is directed to a method of manufacturing SOI wafers by engineering the interface between the polycrystalline silicon charge trap layer (CTL) and the donor substrate to thereby significantly improve the performance of completed RF devices. The properties of a polycrystalline silicon charge trap layer (CTL) depend upon the thermal treatments to which the SOI structure is subjected. In practice, the thermal budget of SOI structure fabrication and device processing is high enough to cause structural changes in the charge trapping layer so it becomes ineffective for improving RF device characteristics. Additionally, contaminants such as boron, aluminum, and other metals which are trapped at the bond interface can readily diffuse through the polycrystalline silicon layer readily and reduce the resistivity of the polycrystalline silicon layer or induce recrystallization of the polycrystalline silicon layer. Either of these effects reduces the effectiveness of the polycrystalline silicon layer at improving the RF performance. The objective of this invention is to provide a method of manufacturing SOI wafers with thermally stable CTLs which preserve the charge trapping effectiveness and significantly improve the performance of completed RF devices.

I. Semiconductor Handle Substrate and Semiconductor Donor Substrate

The substrates for use in the present invention include a semiconductor handle substrate, e.g., a single crystal semiconductor handle wafer and a semiconductor donor substrate, e.g., a single crystal semiconductor donor wafer. The semiconductor device layer in a semiconductor-on-insulator composite structure is derived from the single crystal semiconductor donor wafer. The semiconductor device layer may be transferred onto the semiconductor handle substrate by wafer thinning techniques such as etching a semiconductor donor substrate or by cleaving a semiconductor donor substrate comprising a damage plane.

Figure 1:
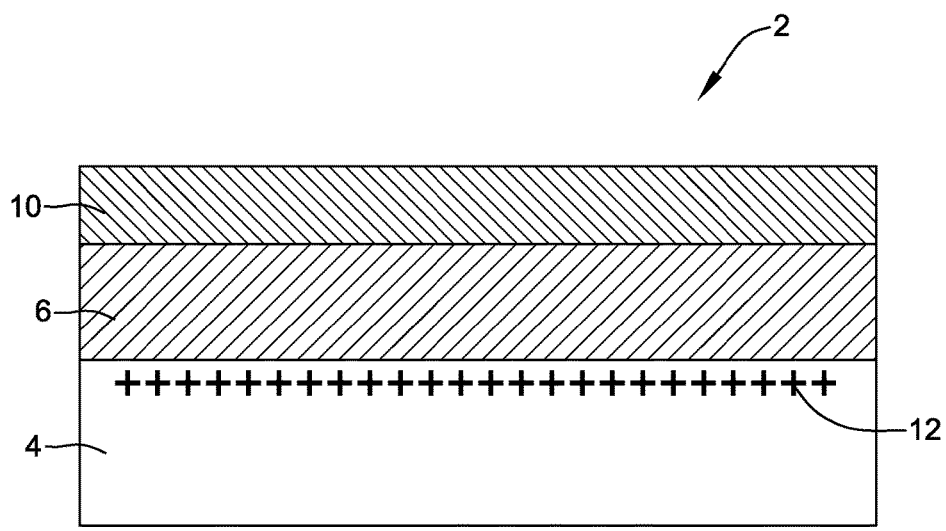
FIG. 1 is a depiction of a silicon-on-insulator wafer comprising a high resistivity substrate and a buried oxide layer.
Figure 2:
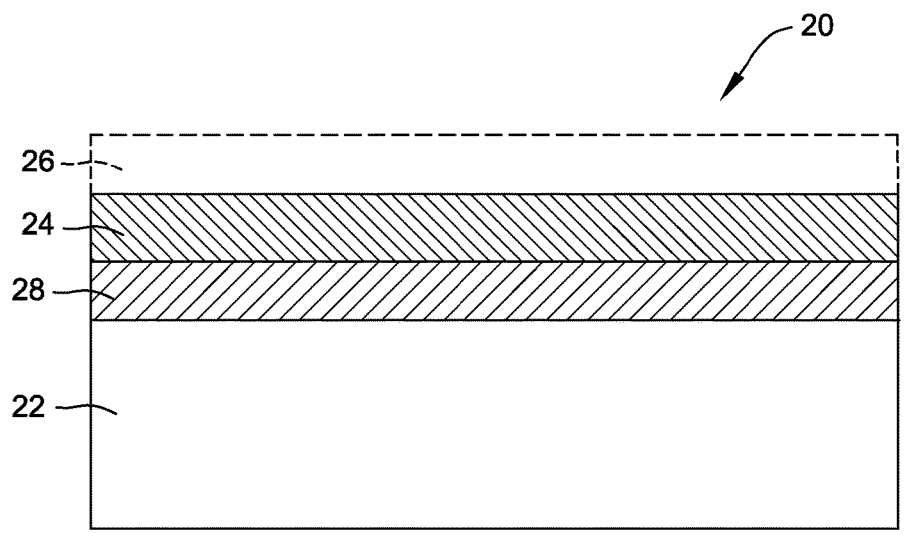
FIG. 2 is a depiction of a silicon-on-insulator wafer according to the prior art, the SOI wafer comprising a polysilicon charge trapping layer between a high resistivity substrate and a buried oxide layer.
Figure 3A:
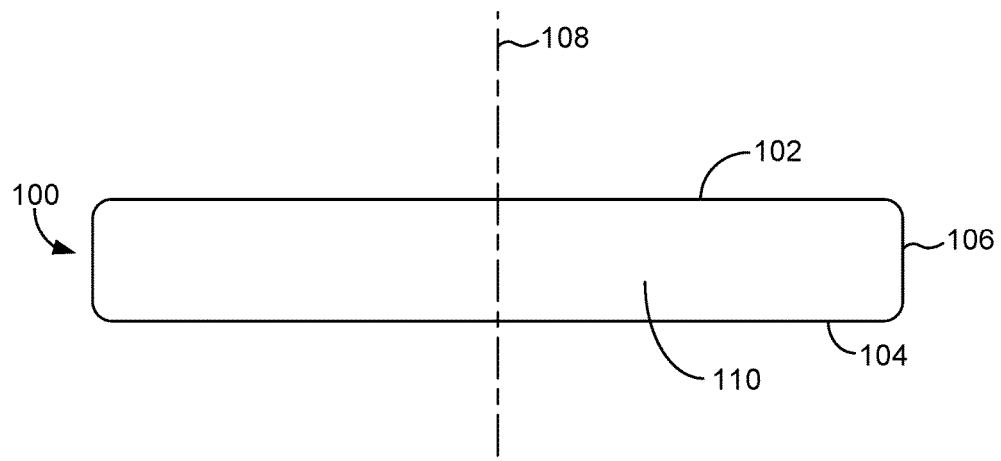
FIGS. 3A through 3E depict a process flow according to some embodiments of the present invention.

FIGS. 3A through 3E depict a process flow according to some embodiments of the present invention. With reference to FIG. 3A, an exemplary, non-limiting single crystal semiconductor handle wafer 100 is depicted. In general, the single crystal semiconductor handle wafer 100 comprises two major, generally parallel surfaces. One of the parallel surfaces is a front surface 102 of the single crystal semiconductor handle wafer 100, and the other parallel surface is a back surface 104 of the single crystal semiconductor handle wafer 100. The single crystal semiconductor handle wafer 100 comprises a circumferential edge 106 joining the front and back surfaces 102, 104. The single crystal semiconductor handle wafer 100 comprise a central axis 108 perpendicular to the two major, generally parallel surfaces 102, 104 and also perpendicular to a central plane defined by the points midway between the front and back surfaces 102, 104. The single crystal semiconductor handle wafer 100 comprises a bulk region 110 between the two major, generally parallel surfaces 102, 104. Since semiconductor wafers, e.g., silicon wafers, typically have some total thickness variation (TTV), warp, and bow, the midpoint between every point on the front surface 102 and every point on the back surface 104 may not precisely fall within a plane. As a practical matter, however, the TTV, warp, and bow are typically so slight that to a close approximation the midpoints can be said to fall within an imaginary central plane which is approximately equidistant between the front and back surfaces 102, 104.

Prior to any operation as described herein, the front surface 102 and the back surface 104 of the single crystal semiconductor handle wafer 100 may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle wafer 100, e.g., a single crystal silicon handle wafer, refers to the major surface of the substrate that becomes an interior surface of the bonded structure. Accordingly, a "back surface" of a single crystal semiconductor handle wafer 100, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure, and a "back surface" of a single crystal semiconductor donor substrate, e.g., a single crystal silicon donor wafer, refers to the major surface that becomes an exterior surface of the bonded structure. In the context of the present invention, one or more insulating layers may be prepared on the front surfaces of either or both the single crystal semiconductor handle substrate 100 and the single crystal semiconductor donor substrate. Upon completion of conventional bonding and wafer thinning steps, the single crystal semiconductor donor substrate forms the semiconductor device layer of the semiconductor-on-insulator (e.g., silicon-on-insulator) composite structure.

The single crystal semiconductor handle substrate and the single crystal semiconductor donor substrate may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be between about 725 micrometers and about 800 micrometers, such as between about 750 micrometers and about 800 micrometers. In some embodiments, the wafer thickness may be about 725 micrometers. In some embodiments, the wafer thickness may be about 775 micrometers.

In some embodiments, the single crystal semiconductor wafers, i.e., single crystal semiconductor handle wafer and single crystal semiconductor donor wafer, comprise interstitial oxygen in concentrations that are generally achieved by the Czochralski-growth method. In some embodiments, the single crystal semiconductor wafers comprise oxygen in a concentration between about 4 PPMA and about 18 PPMA. In some embodiments, the semiconductor wafers comprise oxygen in a concentration between about 10 PPMA and about 35 PPMA. In some embodiments, the single crystal silicon wafer comprises oxygen in a concentration of no greater than about 12 PPMA, such as less than about 10 PPMA. Interstitial oxygen may be measured according to SEMI MF 1188-1105.

The single crystal semiconductor handle wafer 100 may have any resistivity obtainable by the Czochralski or float zone methods. Accordingly, the resistivity of the single crystal semiconductor handle wafer 100 is based on the requirements of the end use/application of the structure of the present invention. The resistivity may therefore vary from milliohm or less to megaohm or more. In some embodiments, the single crystal semiconductor handle wafer 100 comprises a p-type or an n-type dopant. Suitable dopants include boron (p type), gallium (p type), phosphorus (n type), antimony (n type), and arsenic (n type). The dopant concentration is selected based on the desired resistivity of the handle wafer. In some embodiments, the single crystal semiconductor handle substrate comprises a p-type dopant. In some embodiments, the single crystal semiconductor handle substrate is a single crystal silicon wafer comprising a p-type dopant, such as boron.

In some embodiments, the single crystal semiconductor handle wafer 100 has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor handle substrate 100 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), aluminum (p type), indium (p type), phosphorus (n type), antimony (n type), and arsenic (n type).

In some embodiments, the single crystal semiconductor handle wafer 100 has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor handle substrate has a bulk resistivity between about 1000 Ohm-cm and about 6,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

In some preferred embodiments, the single crystal semiconductor handle substrate comprises an electrically active dopant selected from the group consisting of boron, aluminum, gallium, indium, and any combination thereof. In some preferred embodiments, the single crystal semiconductor handle substrate comprises boron, which may be present in a concentration less than about $2\times10^{13}$ atoms/cm$^3$, less than about $1\times10^{13}$ atoms/cm$^3$, such as less than about $5\times10^{12}$ atoms/cm$^3$, or less than about $1\times10^{12}$ atoms/cm$^3$. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The single crystal semiconductor handle wafer 100 may comprise single crystal silicon. The single crystal semiconductor handle wafer 100 may have, for example, any of (100), (110), or (111) crystal orientation, and the choice of crystal orientation may be dictated by the end use of the structure.

Optionally, the front surface 102, the back surface 104, or both may be oxidized according to methods known in the art. Oxidation may be accomplished by means known in the art, such as thermal oxidation (in which some portion of the deposited semiconductor material film will be consumed) or CVD oxide deposition. The oxidation layer on the front surface 102, the back surface 104, or both may be at least about 1 nanometer thick, such as between about 10 nanometers and about 5000 nanometers thick, such as between about 100 nanometers and about 1000 nanometers, or between about 200 nanometers and about 400 nanometers. In some embodiments, the oxidation layer is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution. In some embodiments, the SC1 solution comprises 5 parts deioinized water, 1 part aqueous NH$_4$OH (ammonium hydroxide, 29% by weight of NH$_3$), and 1 part of aqueous H$_2$O$_2$ (hydrogen peroxide, 30%). In some embodiments, the handle substrate may be oxidized by exposure to an aqueous solution comprising an oxidizing agent, such as an SC2 solution. In some embodiments, the SC2 solution comprises 5 parts deioinized water, 1 part aqueous HCl (hydrochloric acid, 39% by weight), and 1 part of aqueous H$_2$O$_2$ (hydrogen peroxide, 30%).

II. Deposition of Charge Trapping Layer

Figure 3B:
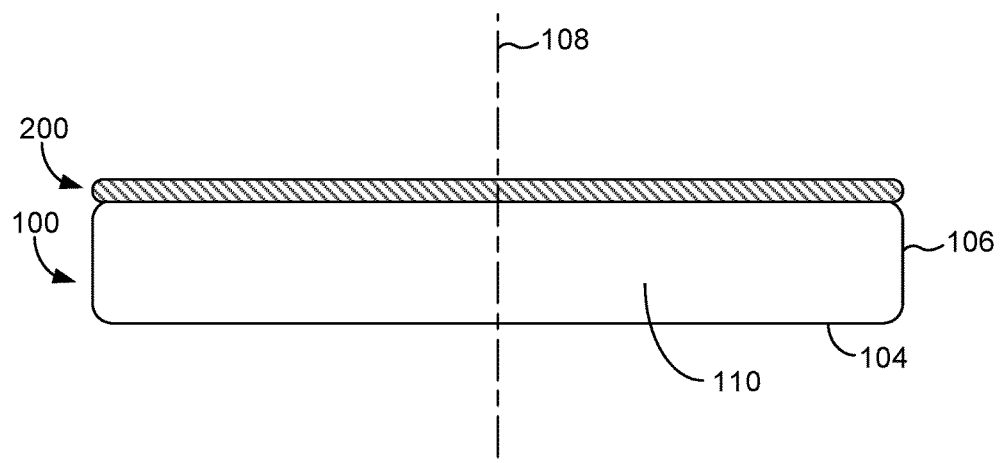

According to the method of the present invention and with reference to FIGS. 3A and 3B, a charge trapping layer 200 is deposited in contact with the front surface 102 of the single crystal semiconductor handle wafer 100. In some embodiments, the charge trapping layer 200 comprises polycrystalline silicon. Such materials include polycrystalline semiconductor materials and amorphous semiconductor materials. Materials that may be polycrystalline or amorphous include silicon (Si), silicon germanium (SiGe), silicon doped with carbon (SiC), and germanium (Ge). Polycrystalline semiconductor, e.g., polycrystalline silicon, denotes a material comprising small silicon crystals having random crystal orientations. Polycrystalline material denotes a material comprising small crystals having random crystal orientations. Polycrystalline grains may be as small in size as about 20 nanometers, and the grain size generally ranges from between about 20 nanometers and about 1 micrometer, such as between about 0.3 micrometer and about 1 micrometer. According to the method of the present invention, the smaller the crystal grain size of polycrystalline material deposited the higher the defectivity in the charge trapping layer. The resistivity of the polycrystalline silicon charge trapping layer may be at least 100 Ohm-cm, at least about 500 Ohm-cm, at least about 1000 Ohm-cm, at least about 3000 Ohm-cm, or even at least about 7000 ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 100,000 Ohm-cm, or between about 750 Ohm-cm and about 100,000 Ohm-cm. In some preferred embodiments, the resistivity of the polycrystalline silicon layer is between about 3000 Ohm-cm and about 100,000 Ohm-cm, such as between about 3000 Ohm-cm and about 10,000 Ohm-cm or even between about 7000 ohm-cm and about 100,000 ohm-cm, such as between about 7000 ohm-cm and about 10,000 ohm-cm.

The material for deposition of the charge trapping layer 200 on the front surface 102 of the single crystal semiconductor handle wafer 100 may be deposited by vapor deposition. The material for deposition of the charge trapping layer 200 may be deposited by chemical or physical vapor deposition, for example, by metalorganic chemical vapor deposition (MOCVD), physical vapor deposition (PVD), chemical vapor deposition (CVD), low pressure chemical vapor deposition (LPCVD), or plasma enhanced chemical vapor deposition (PECVD). In preferred embodiments, polycrystalline silicon is deposited by CVD. Silicon precursors for CVD include methyl silane, silicon tetrahydride (silane), trisilane, disilane, pentasilane, neopentasilane, tetrasilane, dichlorosilane (SiH$_2$Cl$_2$), trichlorosilane (SiHCl$_3$), silicon tetrachloride (SiCl$_4$), among others. In some preferred embodiments, the silicon precursor is selected from among silane, dichlorosilane (SiH$_2$Cl$_2$), and trichlorosilane (SiHCl$_3$). For example, polycrystalline silicon may be deposited onto the surface oxidation layer by CVD of silane, dichlorosilane (SiH$_2$Cl$_2$), and trichlorosilane (SiHCl$_3$) in a temperature greater than about 850° C., such as between about 850° C. and about 1100° C., or between about 850° C. and about 1000° C. The high temperature contributes, among other advantages, high growth rate, thereby contributing to throughput and cost reduction. CVD deposition rates may range be at least about 0.1 micrometer/minute, such as between about 0.1 micrometer/minute to about 10 micrometers/minute, or between about 0.1 micrometer/minute to about 2 micrometers/minute. Deposition of the polycrystalline silicon layer may continue until the layer has a thickness of at least about 0.1 micrometer, such as between about 0.1 micrometer and about 50 micrometers, such as between about 0.1 micrometer and about 20 micrometers, between about 0.1 micrometer and about 10 micrometers, between about 0.5 micrometer and about 5 micrometers, or between about 0.5 micrometer and about 3 micrometers, such as between about 1 micrometer and about 2 micrometers or between about 2 micrometers and about 5 micrometers. Deposition may occur at a pressure between about 1 Torr and about 760 Torr, such as between about 1 Torr and about 400 Torr.

In some embodiments, deposition of the polycrystalline silicon layer by chemical vapor deposition is interrupted after deposition of a polycrystalline silicon seed layer. The polycrystalline silicon seed layer may have a thickness less than the overall desired thickness of the final polycrystalline silicon charge trapping layer. Accordingly, the polycrystalline seed layer may be deposited to a thickness of less than 20 micrometers, less than 10 micrometers, less than 5 micrometers, less than 3 micrometers, less than 2 micrometers, or less than 1 micrometer, or less than 0.5 micrometer, such as between about 50 nanometers and about 20 micrometers, or between about 50 nanometers and about 10 micrometers, or between about 50 nanometers and about 5 micrometers, or between about 50 nanometers and about 3 micrometers, or between about 50 nanometers and about 2 micrometers, or between about 50 nanometers and about 1 micrometers, or between about 50 nanometers and about 500 nanometers, or between about 50 nanometers and about 200 nanometers. The thickness of the seed layer is set by the size of the polysilicon nuclei. To achieve effective stress release, the seed layer needs to cover the surface of the underlying layer while leaving voids smaller than 50 nm, which enables the access of $H_2$ to the interface between the polysilicon seed layer and the underlying layer. $H_2$ reduces interfacial oxide and promotes the diffusion of the atoms at the grain boundaries of the polysilicon seed layer to the substrate and thus releases the film stress. When the seed layer is thick enough to completely prevent $H_2$ access to the underlying layer, the subsequent annealing process is not able to release the film stress effectively. On the other hand, when the seed layer is not continuous and the opening area between two adjacent nuclei is wider than 50 nm, large nuclei are formed during the seed annealing process. The large nuclei will grow into large grains (i.e., diameter >1 um) at the end of polysilicon deposition, which reduces the trapping efficiency. Deposition may be interrupted by ceasing the flow of silicon precursors into the CVD chamber. After interruption of the deposition of polycrystalline silicon, the handle substrate comprising the polycrystalline seed layer may be annealed. Annealing the polycrystalline seed layer contributes to desirable charge trapping layer properties, such as obtaining a clean surface, a high purity film, a high resistivity film, desired nuclei size and uniformity, and reduction of residual film stress. In some embodiments, the polycrystalline silicon seed layer is subjected to a high temperature anneal in order to reduce film stress to a range between about 0 MPa and about 500 MPa, such as between about 0 MPa and about 100 MPa. The polycrystalline seed layer is annealed at a temperature greater than about 1000° C., such as between about 1000° C. and about 1200° C., or between about 1000° C. and about 1100° C. The seed layer may be annealed for a duration between about 1 second and about 300 seconds, such as between about 5 seconds and about 60 seconds, or between about 10 seconds and about 40 seconds. The ambient atmosphere for anneal may comprise hydrogen, hydrogen chloride, chlorine, or any combination of hydrogen, hydrogen chloride, and chlorine. The annealing step can be performed at reduced pressure or atmospheric pressure, such as between about 1 Torr and about 760 Torr, or between about 10 Torr and about 760 Torr. The grain size and the stress of the polycrystalline silicon film is controlled by the annealing temperature, duration, and gas flow. After the appropriate anneal duration, deposition by chemical vapor deposition of the polycrystalline silicon layer is resumed after cooling the single crystal semiconductor handle substrate to a temperature between about 850° C. and about 1000° C.

In some embodiments, the single crystal semiconductor handle substrate 100 and the polycrystalline silicon charge trapping layer 200 is annealed after deposition is complete. Annealing the polycrystalline seed layer contributes to desirable charge trapping layer properties, such as obtaining a clean surface, a high purity film, a high resistivity film, desired nuclei size and uniformity, and reduction of residual film stress. In some embodiments, the fully deposited polycrystalline silicon charge trapping layer is subjected to a high temperature anneal in order to reduce film stress to a range between about 0 MPa and about 500 MPa, such as between about 0 MPa and about 100 MPa. The single crystal semiconductor handle substrate 100 and the polycrystalline silicon charge trapping layer 200 may be annealed at a temperature greater than about 1000° C., such as between about 1000° C. and about 1100° C. The single crystal semiconductor handle substrate 100 and the polycrystalline silicon charge trapping layer 200 may be annealed for a duration between about 1 second and about 300 seconds, such as between about 5 seconds and about 60 seconds, or between about 10 seconds and about 40 seconds. The ambient atmosphere for anneal may comprise hydrogen, hydrogen chloride, chlorine, or any combination of hydrogen, hydrogen chloride, and chlorine. After the appropriate anneal duration, the CVD chamber may be cooled to a temperature safe for removal single crystal semiconductor handle substrate.

After deposition of the charge trapping layer 200, wafer cleaning and polishing is optional. In some embodiments, the deposited polycrystalline silicon charge trapping layer has a surface roughness as measured by $RMS_{2\times 2\ um2}$ on the order of 50 nanometers. If desired, the wafers can be cleaned, for example, in a standard SC1/SC2 solution. Additionally, the wafers, particularly, the optional silicon dioxide layer on the charge trapping layer, may be subjected to chemical mechanical polishing (CMP) to reduce the surface roughness, preferably to the level of $RMS_{2\times 2\ um2}$ is less than about 5 angstroms, such as between about 1 angstrom and about 2 angstroms, wherein root mean squared—

$$R_q = \sqrt{\frac{1}{n}\sum_{i=1}^{n} y_i^2},$$

the roughness profile contains ordered, equally spaced points along the trace, and $y_i$ is the vertical distance from the mean line to the data point. At a surface roughness of preferably less than 2 angstroms, the surface is ready for bonding or optional oxidation.

III. Deposition of an Insulating Layer

Figure 3C:
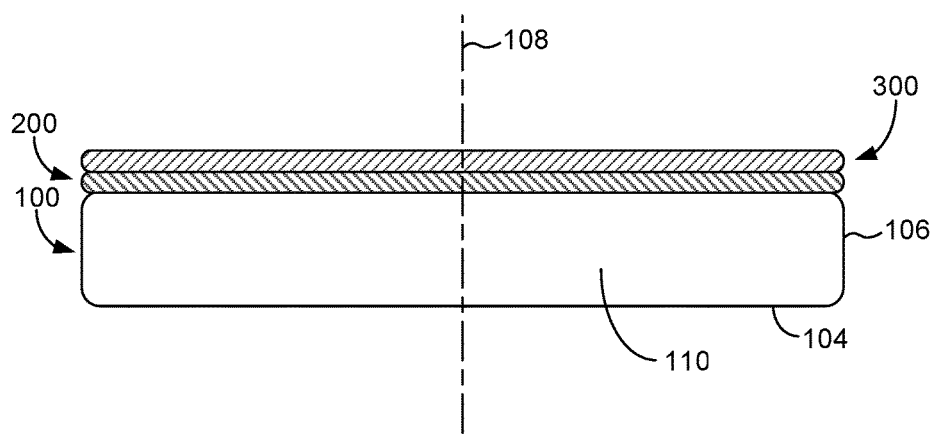

In some embodiments, and with reference to FIGS. 3B and 3C, an insulating layer 300 comprising a semiconductor nitride layer (e.g., silicon nitride) or a semiconductor oxynitride layer (e.g., silicon oxynitride) may be formed in contact with the deposited charge trapping layer 200. This may be accomplished by methods such as thermal nitridation or CVD nitride deposition. In some embodiments, the charge trapping layer may be thermally nitrided (in which some portion of the deposited semiconductor material film will be consumed) or the film may be grown by CVD nitride deposition. In some embodiments, the charge trapping layer may be thermally nitrided in a furnace such as an ASM A400. The temperature may range from 750° C. to 1400° C., such as between 1100° C. and 1400° C., in a nitriding ambient. The nitriding ambient atmosphere can be a mixture of inert gas, such as Ar, and $N_2$ and, optionally, $O_2$. The nitrogen content may vary from 1 to 10 percent, or higher. In an exemplary embodiment, semiconductor handle wafers may be loaded into a vertical furnace, such as an A400. The temperature is ramped to the nitriding temperature with a mixture of Ar and $N_2$ and optionally $O_2$. After the desired silicon nitride or silicon oxynitride thickness has been obtained, the gas flow is turned off and the furnace temperature is reduced and wafers are unloaded from the furnace. An alternative nitrogen source is ammonia. In some embodiments, the charge trapping layer may be treated for a duration sufficient to provide a nitride layer or an oxynitride layer of between about 1.5 nanometers and about 50 nanometers angstroms thickness, such as between about 2.5 nanometers and about 10 nanometers thickness, or between about 2.5 nanometers and about 5 nanometers thickness, such as about 3.5 nanometers thickness.

In some embodiments, an insulating layer 300 comprising a semiconductor nitride layer (e.g., silicon nitride) or a semiconductor oxynitride layer (e.g., silicon oxynitride) may be formed by CVD, such as plasma enhanced chemical vapor deposition. In some embodiments, the plasma deposition tool is a commercially available tool, such as those available from EV Group, such as EVG®810LT Low Temp Plasma Activation System. General requirements of a plasma enhanced CVD chamber include a reactor with various electrode designs, power generation electronics, impedance matching network to transfer power to the gas load, mass flow controllers for input gasses, and pressure control systems. Typical systems are vertical tube reactors powered by an inductively coupled RF source. The single crystal semiconductor handle substrate 100 is loaded into the chamber and placed on a heated support chamber. The chamber is evacuated and backfilled with a nitrogen gas source in a carrier gas, such as argon, to a pressure less than atmospheric to thereby create the plasma. Ammonia and/or nitrogen and/or nitric oxide (NO) and/or nitrous oxide ($N_2O$) gas are suitable source gases for plasma nitride treatment. Oxynitride films may be deposited by including oxygen and nitrogen gas sources. Oxygen and/or water are suitable source gases for plasma oxide treatment. Additionally, the use of nitric oxide or nitrous oxide additionally incorporates oxygen in to the insulating layer, thereby depositing an oxynitride film. To deposit a silicon nitride or a silicon oxynitride plasma film, suitable silicon precursors include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. Suitably, Ar is added as a carrier gas.

Plasma deposition may be varied to tune the properties of the semiconductor nitride (e.g., silicon nitride) or semiconductor oxynitride (e.g., silicon oxynitride). For example, the pressure, flow rate, temperature, and relative ratio of precursors may tune the silicon and nitride molar ratios of the plasma deposited nitride layer. Additionally, inclusion of an oxygen precursor incorporates oxygen to prepare an oxynitride layer. In some embodiments, plasma deposition may occur in an ambient atmosphere comprising silicon and nitrogen precursors to thereby deposit a silicon nitride layer on the handle substrate and/or donor substrate. After a duration sufficient to deposit nitride, an oxygen precursor may be introduced into the atmosphere to thereby deposit oxynitride. The oxygen concentration in the handle semiconductor oxynitride layer may vary according to a gradient, whereby the oxygen concentration is low at the interface with the handle semiconductor nitride layer and increases in the perpendicular direction toward the surface of the handle semiconductor oxynitride layer. After a duration sufficient to deposit an oxynitride layer, the flow of the nitrogen precursor may be ceased and deposition may continue only with silicon precursor and an oxygen gas source to thereby deposit an insulating layer comprising semiconductor oxide, e.g., silicon oxide. In some embodiments, an insulating layer 300 may be deposited by plasma techniques comprising a semiconductor nitride (e.g., silicon nitride) layer and a semiconductor oxynitride (e.g., silicon oxynitride) layer. In some embodiments, an insulating layer 300 may be deposited by plasma techniques comprising a semiconductor nitride (e.g., silicon nitride) layer, a semiconductor oxynitride (e.g., silicon oxynitride) layer, and a semiconductor oxide (e.g., silicon oxide) layer. Advantageously, plasma deposition of multiple insulating layers may occur continuously, i.e., without interruption, by varying the ratios and identities of the process gases.

The plasma deposited semiconductor nitride (e.g., silicon nitride) or semiconductor oxynitride (e.g., silicon oxynitride) may be formed at pressures between about 0.01 Torr and about 100 Torr, such as between about 0.1 Torr and about 1 Torr. Plasma deposition may occur at a temperature between about 20° C. and about 400° C. Insulating layers having a thickness between about 500 angstroms and about 10,000 angstroms, such as between about 2000 angstroms and about 10,000 angstroms can be deposited by PECVD at a rate between about 100 angstroms/minute and about 1000 angstroms/minute.

The flow rate ratios of the gaseous silicon precursor and the gaseous nitrogen precursor may be between about 1/200 and about 1/50, such as about 1/100. These ratios may yield a silicon nitride layer having a molar ratio of silicon to nitride of between about 0.7 and about 1.8. Oxygen may be incorporated in the plasma process, by adding an oxygen containing species such as oxygen or NO. Adding oxygen during plasma deposition enables the deposition of an insulating having compositions that vary in a gradient fashion, e.g., the layer may transition from semiconductor nitride (e.g., silicon nitride) to semiconductor oxynitride (e.g., silicon oxynitride) of increasing oxygen concentration to semiconductor oxide (e.g., silicon oxide).

The refractive index of the insulating layers may be tuned in the range between 1.5 and 2. Post processing anneal and chemical vapor deposition of silicon oxide, $SiO_2$, is possible to further tune the bond interface or hydrogen content of the film. The bonding between the handle substrate and the donor substrate benefits from roughness of less than about 5 angstroms, according to the root mean square method over a 2 micrometer by 2 micrometer surface area, $RMS_{2\times 2\ um2}$. Generally this can be achieved in a plasma deposition with controlled inductively coupled plasma and lowering the bias power below the roughening threshold. Successful layer transfer has been demonstrated on plasma deposited films with roughness of about 5 angstroms or less.

Silicon nitride produced from plasma is structurally distinct from silicon nitride deposited according to conventional chemical or physical vapor deposition techniques. Conventional CVD or PVD deposition generally results in a silicon nitride layer having a stoichiometry of $Si_3N_4$. Plasma processes can be controlled to deposit a film having a composition such as $Si_xN_yH_z$ depending on the ratios of input reactant gasses, power level, substrate temperature, and overall reactor pressure. Pathways in a plasma system exist to form Si—N, Si=N and Si≡N bonds. This is due to the fact that plasma energies produces $Si_xH_z$ and $N_yH_z$ species. For example, the refractive index and optical gap change dramatically with the Si/N ratio. At higher silane concentrations, the films become Si rich and may reach an index of refraction up to 3.0 (compared to 2 for LPCVD). Other properties that may be influenced include dielectric constant, breakdown, mechanical, and chemical (etch rate).

IV. Plasma Activation

In some embodiments, the single crystal semiconductor handle substrate 100 comprising the polycrystalline silicon charge trapping layer 200 and the insulating layer 300 is subjected to oxygen plasma and/or nitrogen plasma surface activation. In some embodiments, the oxygen plasma and/or nitrogen plasma surface activation tool is a commercially available tool, such as those available from EV Group, such as EVG®810LT Low Temp Plasma Activation System. The single crystal semiconductor handle substrate 100 comprising the polycrystalline silicon charge trapping layer 200 and the insulating layer 300 is loaded into the chamber. The chamber is evacuated and backfilled with an oxygen gas source and/or a nitrogen gas source in a carrier gas, such as argon, to a pressure less than atmospheric to thereby create the plasma. Oxygen and/or water are suitable source gases for plasma oxide treatment. Ammonia and/or nitrogen and/or nitric oxide (NO) and/or nitrous oxide ($N_2O$) gas are suitable source gases for plasma nitride treatment. Oxynitride plasma activation may include oxygen and nitrogen gas sources in the ambient atmosphere. The single crystal semiconductor handle substrate 100 is exposed to this plasma for the desired time, which may range from about 1 second to about 120 seconds. Oxygen or nitrogen plasma surface oxidation is performed in order to render the front surface of the single crystal semiconductor handle substrate 100 hydrophilic and amenable to bonding to a single crystal semiconductor donor substrate. After plasma activation, the activated surface is rinsed with deionized water. The wafer is then spun dry prior to bonding.

V. Preparation of the Bonded Structure

Figure 3D:
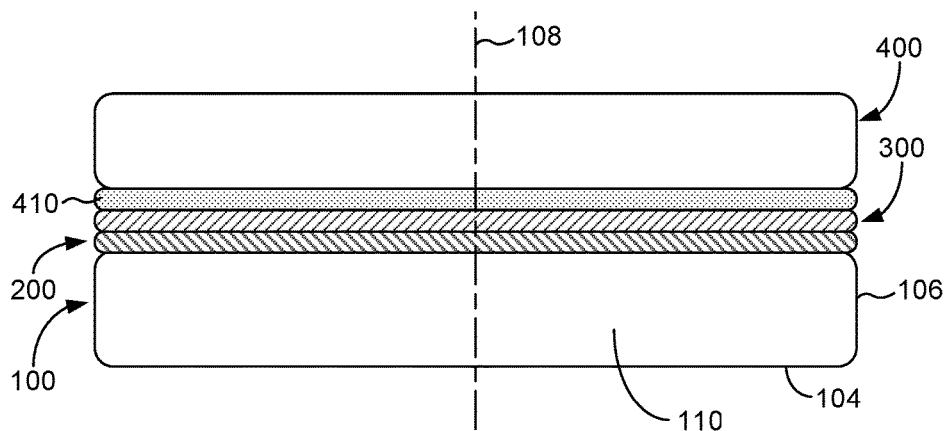
Figure 3E:
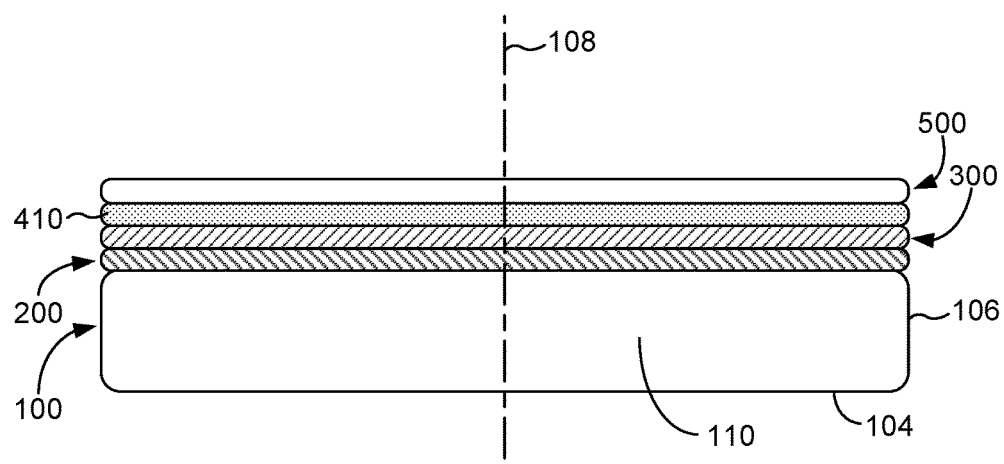

With reference to FIG. 3D, the high resistivity single crystal semiconductor handle substrate 100, e.g. a single crystal semiconductor handle wafer such as a single crystal silicon handle wafer, prepared according to the method described herein comprising the polycrystalline silicon charge trapping layer 200 and the insulating layer 300 is next bonded to a semiconductor donor substrate 400, e.g., a single crystal semiconductor donor wafer, which is prepared according to conventional layer transfer methods. The single crystal semiconductor donor substrate 400 may be a single crystal semiconductor wafer. In preferred embodiments, the semiconductor wafer comprises a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor (e.g., silicon) donor wafer 400 may comprise a dopant selected from among boron (p type), gallium (p type), aluminum (p type), indium (p type), phosphorus (n type), antimony (n type), and arsenic (n type)s. The resistivity of the single crystal semiconductor (e.g., silicon) donor wafer may range from 1 to 50 Ohm-cm, typically, from 5 to 25 Ohm-cm. The single crystal semiconductor donor wafer 400 may be subjected to standard process steps including oxidation, implant, and post implant cleaning. Accordingly, a semiconductor donor substrate 400, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate.

In some embodiments, the semiconductor donor substrate 400 comprises a dielectric layer 410. The dielectric layer 410 according to the present invention may comprise insulating materials selected from among silicon dioxide, silicon nitride, silicon oxynitride, hafnium oxide, titanium oxide, zirconium oxide, lanthanum oxide, barium oxide, and any combination thereof. In some embodiments, the dielectric layer 410 comprises one or more insulating layers comprising a material selected from the group consisting of silicon dioxide, silicon nitride, silicon oxynitride, and any combination thereof. In some embodiments, the dielectric layer has a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, the dielectric layer 410 comprises multiple layers of insulating material. The dielectric layer may comprise two insulating layers, three insulating layers, or more. Each insulating layer may comprise a material selected from among silicon dioxide, silicon oxynitride, silicon nitride, hafnium oxide, titanium oxide, zirconium oxide, lanthanum oxide, barium oxide, and any combination thereof. In some embodiments, each insulating layer may comprise a material selected from the group consisting of silicon dioxide, silicon nitride, siliconoxynitride, and any combination thereof. Each insulating layer may have a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, the front surface of the single crystal semiconductor donor substrate 400 (e.g., a single crystal silicon donor substrate) may be thermally oxidized (in which some portion of the deposited semiconductor material film will be consumed) to prepare the semiconductor oxide film, or the semiconductor oxide (e.g., silicon dioxide) film may be grown by CVD oxide deposition. In some embodiments, the front surface of the single crystal semiconductor donor substrate 400 may be thermally oxidized in a furnace such as an ASM A400 in the same manner described above. In some embodiments, the single crystal semiconductor donor substrate 400 is oxidized to provide an oxide layer on the front surface layer of at least about 1 nanometer thick, about 10 nanometer thick, such as between about 10 nanometers and about 10,000 nanometers, between about 10 nanometers and about 5,000 nanometers, or between about 100 nanometers and about 400 nanometers. In some embodiments, the oxidation layer on the single crystal semiconductor donor substrate 400 is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution.

Ion implantation may be carried out in a commercially available instrument, such as an Applied Materials Quantum II, a Quantum LEAP, or a Quantum X. Implanted ions include He, H, $H_2$, or combinations thereof. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$, such as from about $10^{15}$ ions/cm$^2$ to about $10^{16}$ ions/cm$^2$. Implant energies may range from about 1 keV to about 3,000 keV, such as from about 10 keV to about 3,000 keV. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth of implantation determines the thickness of the single crystal semiconductor device layer in the final SOI structure. The ions may be implanted to a depth between about 100 angstroms and about 30,000 angstroms, such as between about 200 angstroms and about 20,000 angstroms, such as between about 2000 angstroms and about 15,000 angstroms, or between about 15,000 angstroms and about 30,000 angstroms. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor substrate 400 having an ion implant region therein formed by $He^+$, $H^+$, $H_2^+$, and any combination thereof ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 350° C., preferably about 350° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ or $N_2$ to a pressure less than atmospheric to thereby create the plasma. The single crystal semiconductor donor wafer is exposed to this plasma for the desired time, which may range from about 1 second to about 120 seconds. Oxygen or nitrogen plasma surface oxidation is performed in order to render the front surface of the single crystal semiconductor donor substrate hydrophilic and amenable to bonding to a single crystal semiconductor handle substrate prepared according to the method described above. After plasma activation, the activated surface is rinsed with deionized water. The wafer is then spun dry prior to bonding.

The hydrophilic front surface layer of the single crystal semiconductor donor substrate 400 and the front surface of single crystal semiconductor handle substrate 100 comprising the polycrystalline silicon charge trapping layer 200 and the insulating layer 300 are next brought into intimate contact to thereby form a bonded structure. The bonded structure comprises a dielectric layer 410, e.g., a buried oxide such as silicon oxide.

Since the mechanical bond is relatively weak, the bonded structure is further annealed to solidify the bond between the single crystal semiconductor donor substrate 400 and the single crystal semiconductor handle substrate 100 comprising the polycrystalline silicon charge trapping layer 200 and the insulating layer 300. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 350° C., from about 225° C. to about 350° C., preferably about 350° C. Thermal annealing may occur for a duration of from about 0.5 hours to about 10 hour, preferably a duration of about 2 hours. Thermal annealing within these temperatures ranges is sufficient to form a thermally activated cleave plane. After the thermal anneal to activate the cleave plane, the bonded structure may be cleaved.

In some embodiments, the anneal may occur at relatively high pressures, such as between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa. In conventional bonding methods, the temperature is likely limited by the "autocleave". This occurs when the pressure of the platelets at the implant plane exceeds the external isostatic pressure. Accordingly, conventional anneal may be limited to bonding temperatures between about 350° C. and about 400° C. because of autocleave. After implantation and bond, the wafers are weakly held together. But the gap between the wafers is sufficient to prevent gas penetration or escape. Weak bonds can be strengthened by heat treatments, but the cavities formed during implant are filled with gas. While heating, the gas inside the cavities pressurizes. It is estimated that the pressure may reach 0.2-1 GPa (Cherkashin et al., J. Appl. Phys. 118, 245301 (2015)), depending on the dosage. When the pressure exceeds a critical value, the layer delaminates. This is referred to as an autocleave or thermal cleave. It prevents higher temperature or longer time in the anneal. According to some embodiments of the present invention, bonding occurs at elevated pressures, e.g., between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa, which thereby enables bonding at elevated temperatures. In some embodiments, the bonded structure is annealed at a temperature of from about 300° C. to about 700° C., from about 400° C. to about 600° C., such as between about 400° C. and about 450° C., or even between about 450° C. and about 600° C., or between about 350° C. and about 450° C. Increasing the thermal budget will have a positive effect on the bond strength. Thermal annealing may occur for a duration of from about 0.5 hours to about 10 hour, such as between about 0.5 hours and about 3 hours, preferably a duration of about 2 hours. Thermal annealing within these temperatures ranges is sufficient to form a thermally activated cleave plane. In conventional bonding anneals, the edge of both the handle wafer and donor wafer may become far apart due to the roll off. In this area, there is no layer transfer. It is called the terrace. Pressurized bonding is expected to reduce this terrace, extending the SOI layer further out towards the edge. The mechanism is based on trapped pockets of air being compressed and "zippering" outwards. After the thermal anneal to activate the cleave plane, the bonded structure may be cleaved.

After the thermal anneal, the bond between the single crystal single crystal semiconductor donor substrate 400 and the single crystal semiconductor handle substrate 100 comprising the polycrystalline silicon charge trapping layer 200 and the insulating layer 300 is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a single crystal semiconductor device layer 500, preferably a silicon device layer, on the semiconductor-on-insulator composite structure. See FIG. 3E.

After cleaving, the cleaved structure may be subjected to a high temperature anneal in order to further strengthen the bond between the transferred device layer 500 and the single crystal semiconductor handle substrate 100 comprising the polycrystalline silicon charge trapping layer 200 and the insulating layer 300. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 2 to 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor device layer may be brought to the desired thickness and smoothness by subjecting to a vapor phase HCl etch process in a horizontal flow single wafer epitaxial reactor using $H_2$ as a carrier gas. In some embodiments, the semiconductor device layer 500 may have a thickness between about 10 nanometers and about 20 micrometers, between about 20 nanometers and about 3 micrometers, such as between about 20 nanometers and about 2 micrometers, such as between about 20 nanometers and about 1.5 micrometers or between about 1.5 micrometers and about 3 micrometers. Thick film device layers may have a device layer thickness between about 1.5 micrometers and about 20 micrometers. Thin film device layers may have a thickness between about 0.01 micrometer and about 0.20 micrometer.

In some embodiments, an epitaxial layer may be deposited on the transferred single crystal semiconductor device layer 500. A deposited epitaxial layer may comprise substantially the same electrical characteristics as the underlying single crystal semiconductor device layer 500. Alternatively, the epitaxial layer may comprise different electrical characteristics as the underlying single crystal semiconductor device layer 500. An epitaxial layer may comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the epitaxial layer may comprise a dopant selected from among boron (p type), gallium (p type), aluminum (p type), indium (p type), phosphorus (n type), antimony (n type), and arsenic (n type). The resistivity of the epitaxial layer may range from 1 to 50 Ohm-cm, typically, from 5 to 25 Ohm-cm. In some embodiments, the epitaxial layer may have a thickness between about 10 nanometers and about 20 micrometers, between about 20 nanometers and about 3 micrometers, such as between about 20 nanometers and about 2 micrometers, such as between about 20 nanometers and about 1.5 micrometers or between about 1.5 micrometers and about 3 micrometers.

The finished SOI wafer comprises the single crystal semiconductor handle substrate 100, the polycrystalline silicon charge trapping layer 200, the insulating layer 300, the dielectric layer 410 (e.g., buried oxide layer), and the semiconductor device layer 500, may then be subjected to end of line metrology inspections and cleaned a final time using typical SC1-SC2 process.

EXAMPLE 1

Donor wafers were oxidized in an ASM400 vertical furnace. The oxide was grown to match the thickness of the BOX layer desired in the final semiconductor-on-insulator structure. After oxidation, donor wafers were subjected to helium and hydrogen implant with implant energies chosen to place the ions at a depth in the silicon donor wafer to achieve the desired silicon device layer thickness in the final SOI structure. Wafers were prepared for bonding by subjecting them to a piranha clean, followed by SC1/SC2 cleaning according to standard industry methods.

Handle wafers (resistivity greater than 3000 ohm-cm) were prepared. Polycrystalline silicon was deposited and polished to achieve a roughness of less than 5 angstroms RMS. The wafers were cleaned by SC1/SC2 cleaning according to standard industry methods. The donor wafers and the handle wafers were loaded into the EVG®810LT Low Temp Plasma Activation System. The chamber was evacuated and backfilled with $N_2$ to a pressure of 0.32 Torr, and the wafer surfaces were plasma activated exposure to the nitrogen plasma for 15 seconds. After plasma activation, the activated surfaces were rinsed with deionized water. The handle and donor wafers were spun dry prior to bonding. The donor wafer and handle wafer were loaded into the bonding chamber of the EVG®810LT Low Temp Plasma Activation System and bonded. Additional wafers were similarly prepared except that the handle and donor wafers were subject to oxygen plasma prior to bonding.

The bonded pair was subjected to a heat treatment for 90 minutes at 350° C., after which the bonded structure was placed in a convention cleave station. The bonded structure was affixed to stationary cups on one side and affixed to additional suction cups on a hinged arm on the other side. A crack was initiated near the suction cup attachment, and the movable arm pivots about the hinge, cleaving the wafer.

The resulting SOI wafers were cleaned by SC1/SC2 cleaning according to standard industry methods. The cleaned wafers were loaded into an ASM400 furnace and subjected to high temperature anneal to further strengthen the bond between the transferred device layer 500 and the handle substrate consisting of the CTL layer and single crystal substrate. After annealing, the wafers were subjected to a dip in dilute aqueous hydrofluoric acid solution to remove the thin oxide grown during anneal, which was followed by SC1/SC2 cleaning according to standard industry methods. The single crystal semiconductor device layer of the SOI wafer was brought to the desired thickness and smoothness by subjecting it to a vapor phase HCl etch process in a horizontal flow single wafer epitaxial reactor using $H_2$ as the carrier gas.

Figure 4A:
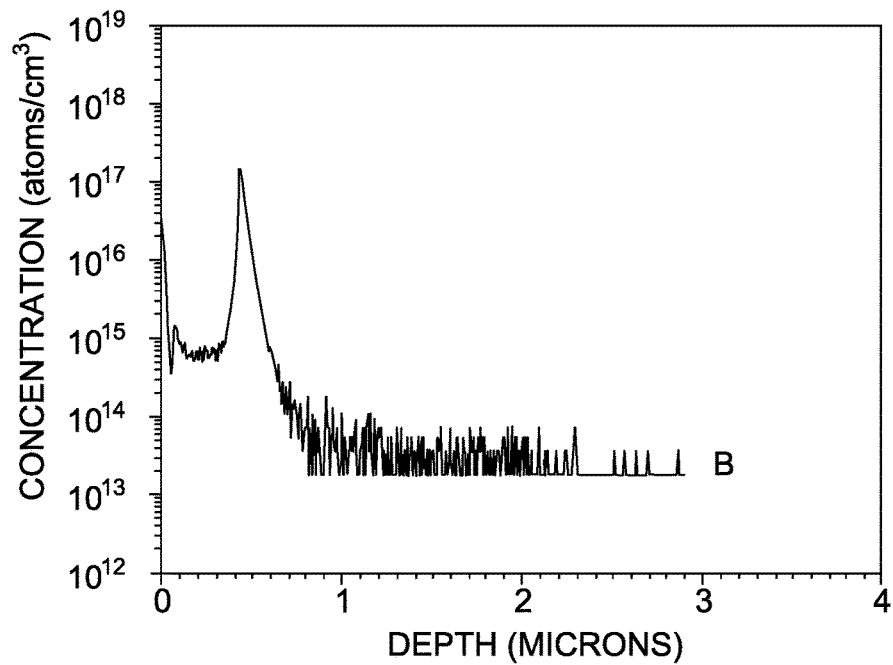
FIG. 4A is a graph depicting boron concentration profiles in a silicon on insulator wafer subjected to a nitrogen plasma to thereby deposit a silicon nitride dielectric layer.
Figure 4B:
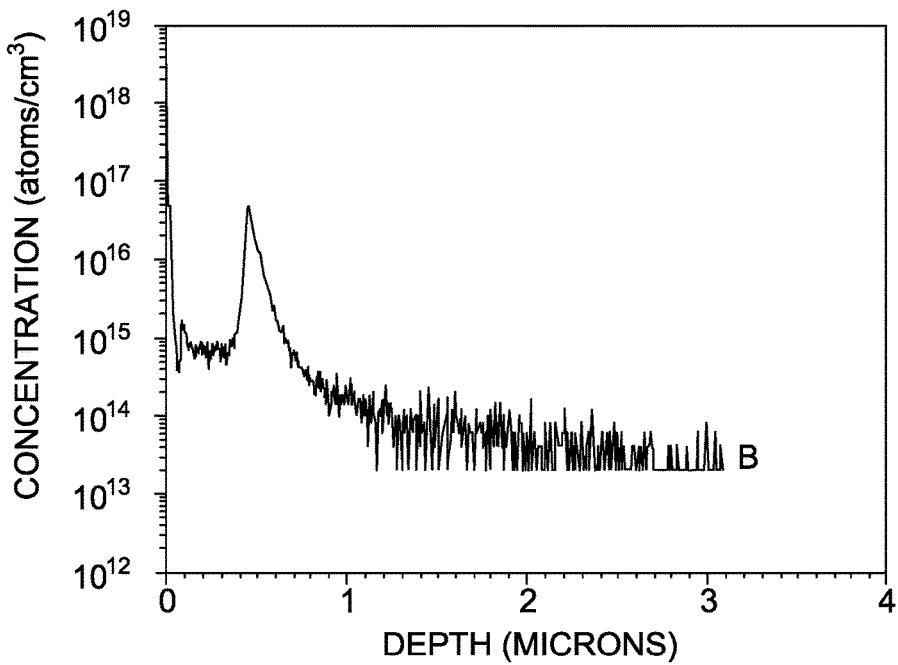
FIG. 4B is a graph depicting boron concentration profiles in a silicon on insulator wafer subjected to an oxygen plasma to thereby deposit a silicon dioxide dielectric layer.

Boron profiles through the SOI, BOX, and CTL layers were obtained from sample wafers by SIMS for wafers that were plasma activated by nitrogen and by oxygen. See FIGS. 4A and 4B. The boron content in the wafer subjected to nitrogen plasma activation is concentrated at the bond interface and has not diffused into the polycrystalline silicon CTL layer, indicating that the nitrogen plasma layer generated an efficient diffusion barrier. In contrast, the wafer subjected to oxygen plasma activation demonstrated higher boron content in the polycrystalline silicon CTL layer, indicating that some of the boron initially trapped at the bond interface was able to diffuse into the CTL during post-bond annealing.

Figure 5:
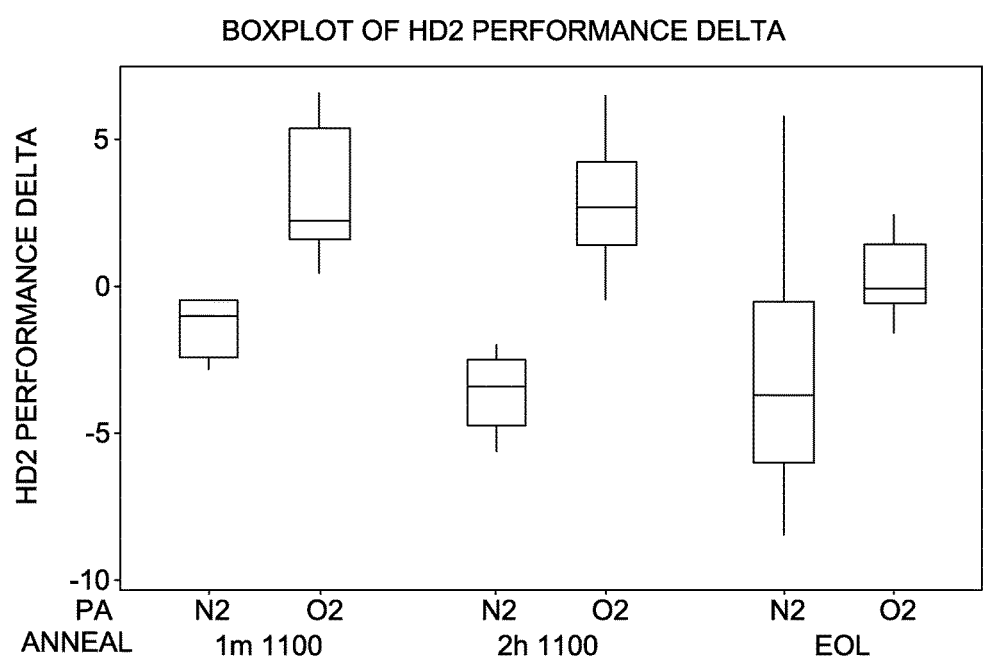
FIG. 5 is a graph depicting the $2^{nd}$ harmonic relative power by CPW test. The test compares wafers prepared by nitrogen plasma deposition and oxygen plasma deposition.

Other wafers from both groups were subjected to various high temperature stressing anneal to simulate a semiconductor manufacturing front end of the line thermal cycle. The silicon device layer was stripped, and Co-planar Waveguide (CPW) structures were built. $2^{nd}$ order harmonic distortion was measured on these structures to infer the integrity of the charge trapping layer. It was found that the wafers bonded using the $N_2$ plasma performed about 5 dBm better than the $O_2$ plasma group. See FIG. 5.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A multilayer structure comprising:
    a single crystal semiconductor handle substrate comprising two major, generally parallel surfaces, one of which is a front surface of the single crystal semiconductor handle substrate and the other of which is a back surface of the single crystal semiconductor handle substrate, an imaginary central plane between the front surface and the back surface, a circumferential edge joining the front and back surfaces of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm;
    a charge trapping layer comprising a polycrystalline silicon layer, the charge trapping layer being in interfacial contact with the front surface of the single crystal semiconductor handle substrate, wherein the charge trapping layer has a minimum resistivity of at least about 1000 ohm-cm;
    an insulating layer comprising silicon nitride or silicon oxynitride in interfacial contact with the charge trapping layer comprising the polycrystalline silicon layer;
    a dielectric layer in interfacial contact with the insulating layer, the dielectric layer comprising silicon dioxide; and
    a single crystal silicon device layer, wherein the single crystal silicon device layer is in interfacial contact with the dielectric layer.

2. The multilayer structure of claim 1 wherein the single crystal semiconductor handle substrate comprises single crystal silicon.

3. The multilayer structure of claim 1 wherein the single crystal semiconductor handle substrate comprises a single crystal silicon wafer sliced from a single crystal silicon ingot grown by the Czochralski method or the float zone method.

4. The multilayer structure of claim 1 wherein the single crystal semiconductor handle substrate has a bulk resistivity between about 500 Ohm-cm and about 100,000 Ohm-cm.

5. The multilayer structure of claim 1 wherein the single crystal semiconductor handle substrate has a bulk resistivity between about 1000 Ohm-cm and about 100,000 Ohm-cm.

6. The multilayer structure of claim 1 wherein the single crystal semiconductor handle substrate has a bulk resistivity between about 1000 Ohm-cm and about 6,000 Ohm-cm.

7. The multilayer structure of claim 1 wherein the single crystal semiconductor handle substrate has a bulk resistivity between about 3000 Ohm-cm and about 5,000 Ohm-cm.

8. The multilayer structure of claim 1 wherein the charge trapping layer has a minimum resistivity of at least about 3000 ohm-cm.

9. The multilayer structure of claim 1 wherein the charge trapping layer has a minimum resistivity of at least about 7000 ohm-cm.

10. The multilayer structure of claim 1 wherein the insulating layer comprises silicon nitride.

11. The multilayer structure of claim 1 wherein the insulating layer comprises silicon oxynitride layer.

12. The multilayer structure of claim 1 wherein the insulating layer has a thickness between about 2000 angstroms and about 10,000 angstroms.

13. The multilayer structure of claim 1 wherein the dielectric layer further comprises a material selected from the group consisting of silicon nitride, silicon oxynitride, hafnium oxide, titanium oxide, zirconium oxide, lanthanum oxide, barium oxide, and a combination thereof.

14. The multilayer structure of claim 1 wherein the dielectric layer further comprises a material selected from the group consisting of silicon nitride, silicon oxynitride, and a combination thereof.

15. The multilayer structure of claim 1 wherein the dielectric layer comprises an insulating layer having a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

16. A multilayer structure comprising:
    a single crystal semiconductor handle substrate comprising two major, generally parallel surfaces, one of which is a front surface of the single crystal semiconductor handle substrate and the other of which is a back surface of the single crystal semiconductor handle substrate, an imaginary central plane between the front surface and the back surface, a circumferential edge joining the front and back surfaces of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm;

a semiconductor oxide in interfacial contact with the front surface of the single crystal semiconductor handle substrate;

a charge trapping layer comprising a polycrystalline silicon layer, the charge trapping layer being in interfacial contact with the semiconductor oxide, wherein the charge trapping layer has a minimum resistivity of at least about 1000 ohm-cm;

an insulating layer comprising silicon nitride or silicon oxynitride in interfacial contact with the charge trapping layer comprising the polycrystalline silicon layer;

a dielectric layer in interfacial contact with the insulating layer, the dielectric layer comprising two or more layers, wherein each of the two or more layers comprises a material selected from the group consisting of silicon dioxide, silicon oxynitride, and silicon nitride, and further wherein at least one layer comprises silicon dioxide; and a single crystal silicon device layer, wherein the single crystal silicon device layer is in interfacial contact with the dielectric layer.

\* \* \* \* \*